United States Patent
Early et al.

(10) Patent No.: US 7,046,039 B1
(45) Date of Patent: May 16, 2006

(54) CLASS AB ANALOG INVERTER

(75) Inventors: Adrian B. Early, Snohomish, WA (US); Harold M. Kutz, Snoquolmie, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 207 days.

(21) Appl. No.: 10/306,381

(22) Filed: Nov. 27, 2002

Related U.S. Application Data

(60) Provisional application No. 60/334,216, filed on Nov. 29, 2001.

(51) Int. Cl.
*H03K 19/0175* (2006.01)
(52) U.S. Cl. .................................. 326/83; 327/108
(58) Field of Classification Search ............... 327/108, 327/111, 112; 326/82, 83, 8, 86
See application file for complete search history.

(56) References Cited

U.S. PATENT DOCUMENTS

| | | | | |
|---|---|---|---|---|
| 4,791,326 A | * | 12/1988 | Vajdic et al. | 327/391 |
| 5,382,916 A | * | 1/1995 | King et al. | 330/253 |
| 6,259,280 B1 | * | 7/2001 | Koelling | 327/53 |
| 6,265,929 B1 | * | 7/2001 | Hauser | 327/404 |
| 6,512,393 B1 | * | 1/2003 | Whitworth et al. | 326/30 |

* cited by examiner

*Primary Examiner*—Don Le
(74) *Attorney, Agent, or Firm*—Wagner, Murabito & Hao LLP

(57) ABSTRACT

A class AB analog inverter comprising cascoded n-channel (NMOS) and p-channel (PMOS) transistors. The inverter uses complementary devices, of which one or more may be a first transistor in cascode with a second transistor. The first and second transistors may have the same threshold voltage ($V_T$), or may have different threshold voltages. The class AB inverter provides improved slew rate and low power capabilities for use in mixed-signal integrated circuits such as analog-to-digital converters (ADCs), digital-to-analog converters (DACs), and active filters.

17 Claims, 6 Drawing Sheets

CLASS AB ANALOG INVERTER

RELATED U.S. PATENT APPLICATION

This Application claims a Priority Date of Nov. 29, 2001, benefited from a previously filed Provisional Application No. 60/334,216 filed on Nov. 29, 2001 by a same Inventor of this Patent Application.

FIELD OF THE INVENTION

Embodiments of the present invention relate to the field of complementary metal-oxide (CMOS) semiconductor circuits. More particularly, embodiments of the present invention relate to CMOS circuits with both n-channel and p-channel low threshold voltage ($V_T$) transistors.

BACKGROUND ART

Continuing improvements in semiconductor processing techniques have produced a continuing trend in the reduction of feature sizes in integrated circuits (ICs). Smaller transistors have in turn led to smaller power requirements and lower operating voltages. Lower power and low voltage ICs have enabled a broad range of battery powered mobile devices.

Many low power/low voltage devices require both analog and digital circuits. These circuits include amplifiers, digital logic, and interface circuits such as analog-to-digital converters (ADCs) and digital-to-analog converters (DACs).

In general, the optimization of an analog IC requires a different fabrication process than a digital IC. For example, a bipolar process may be preferred for an analog circuit and a CMOS process for a digital circuit. This difference is usually not a problem when a system can be designed using integrated circuits that are exclusively analog or digital. However, for mixed-signal ICs such as ADCs and DACs, both digital and analog circuits are required on the same chip. Examples of analog functions that may be included in a mixed-signal chip are delta sigma modulators, reconstruction filters, and switched capacitor filters. These functions and others often require an amplifier as a building block.

Although a process such as BiCMOS may be used to provide enhanced performance for analog circuits in a mixed-signal IC, BiCMOS is more complex and more expensive than CMOS. Thus, it is often desirable to design an analog circuit using CMOS in order to reduce cost, in spite of the performance limitations. The combination of analog and digital circuits usually entails a process compromise.

Another problem associated with mixed-signal ICs is the noise associated with switching in the digital circuits, and the susceptibility of the analog circuits to the noise. Although design techniques such as cascading of devices may be used improve noise immunity, cascading in circuits with a low supply voltage is constrained by the fact that transistor threshold voltages do not scale down with reduced feature size. A conventional cascode used in a low voltage circuit (e.g. less than 1.5V) may have insufficient voltage headroom.

SUMMARY OF INVENTION

Accordingly, embodiments of the present invention provide an amplifier circuit for use in mixed-signal integrated circuits (ICs). The amplifier uses a class AB analog inverter with a cascode configuration to enhance performance in the mixed-signal environment, and may be fabricated using a modified CMOS process to further enhance operation using low threshold voltage ($V_T$) transistors.

A class AB analog inverter comprising cascoded n-channel (NMOS) and p-channel (PMOS) transistors is disclosed. The inverter utilizes complementary devices, of which one or more may be a normal threshold transistor in cascode with a low VT transistor. The class AB inverter provides improved slew rate and low power capabilities for use in mixed-signal integrated circuits such as analog-to-digital converters (ADCs), digital-to-analog converters (DACs), and active filters.

In one embodiment, a mixed-signal integrated circuit comprises a class AB analog inverter circuit. The inverter circuit comprises five CMOS devices, each having a drain, a gate, and a source. Each CMOS device may be an individual transistor, or a normal $V_T$ transistor in cascode with a low $V_T$ transistor. The first and second CMOS devices have a common source and common gate. The third CMOS device has a drain coupled to the drain of the first CMOS device and the gate of the first CMOS device, and a source coupled to the gate of the fourth CMOS device. The fourth CMOS device has a drain coupled to the drain of the second CMOS device. The fifth CMOS device has a source coupled to the source of the third CMOS device, and a drain coupled to the source of the fourth CMOS device.

In another embodiment, a mixed-signal integrated circuit comprises a class AB analog inverter circuit. The inverter circuit comprises five CMOS devices, each having a drain, a gate, and a source. Each CMOS device may be an individual transistor, or a normal $V_T$ transistor in cascode with a low $V_T$ transistor. The first and second CMOS devices have a common source and common gate. The third CMOS device has a drain coupled to the drain of the first CMOS device and the gate of the first CMOS device, and a source coupled to the source of the fifth CMOS device. The fourth CMOS device has a drain coupled to the drain of the second CMOS device, a gate coupled to the gate of the fifth CMOS device, and a source coupled to the drain of the fifth CMOS device.

DESCRIPTION OF THE PREFERRED EMBODIMENTS

In the following detailed description of the present invention, a class AB analog inverter; numerous specific details are set forth in order to provide a thorough understanding of the present invention. However, it will be obvious to one skilled in the art that the present invention may be practiced without these specific details. In other instances well known processes, components, and circuits have not been described in detail so as not to unnecessarily obscure aspects of the present invention.

Figure 1A:
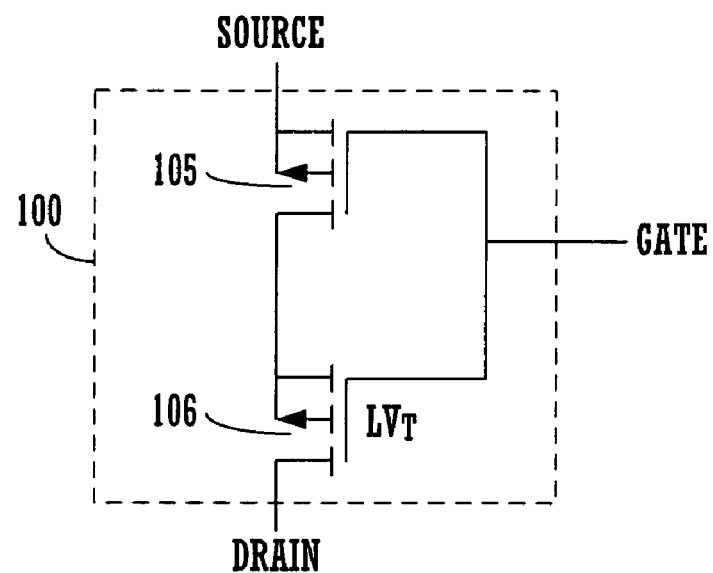
FIG. 1A shows a schematic diagram of a p-channel (PMOS) composite threshold cascode device in accordance with an embodiment of the present claimed invention.

FIG. 1A shows a schematic diagram of a p-channel (PMOS) composite threshold cascode device 100. The device 100 comprises a p-channel MOSFET 105 having a normal $V_T$ (e.g., about 1 volt) in cascode with a low $V_T$ (e.g., 0.4–0.5 volts) p-channel MOSFET 106. The source of MOSFET 105 provides the source for the device 100. The drain of MOSFET 105 is coupled to the source of MOSFET 106. The drain of MOSFET 106 forms the drain of the device 100. The gate of MOSFET 105 is coupled to the gate of MOSFET 106, and forms the gate of the device 100.

Figure 1B:
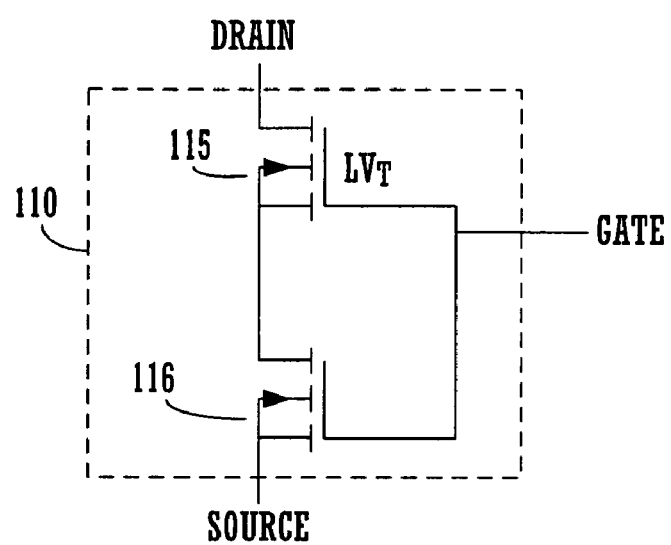
FIG. 1B shows a schematic diagram of an n-channel (NMOS) composite threshold cascode device in accordance with an embodiment of the present claimed invention.

FIG. 1B shows a schematic diagram of an n-channel (NMOS) composite threshold cascode device 110. The device 110 comprises an n-channel MOSFET 116 having a normal $V_T$ (e.g., about 1 volt) in cascode with a low $V_T$ (e.g. 0.4–0.5 volts) n-channel MOSFET 115. The source of MOSFET 116 provides the source for the device 110. The drain of MOSFET 116 is coupled to the source of MOSFET 115. The drain of MOSFET 115 forms the drain of the device 110. The gate of MOSFET 116 is coupled to the gate of MOSFET 115, and forms the gate of the device 110.

The composite threshold devices 100 and 110 shown in FIGS. 1A and 1B are disclosed in a U.S. Patent Application titled "Self-Biased CMOS Cascode Circuit," assigned to the assignee of the present application and filed on Nov. 27, 2002; the entire contents of which are incorporated herein by reference.

A process for fabricating both p-channel low $V_T$ MOSFETs and n-channel low threshold voltage MOSFETs on a single integrated circuit substrate is disclosed in a U.S. Patent Application titled "Processes Providing High and Low Threshold P-Type and N-Type Transistors," assigned to the assignee of the present application and filed on Nov. 27, 2002; the entire contents of which are incorporated herein by reference. The process of the above mentioned application may be used to fabricate devices 100 and 110 shown in FIGS. 1A and 1B, on the same substrate.

Figure 2A:
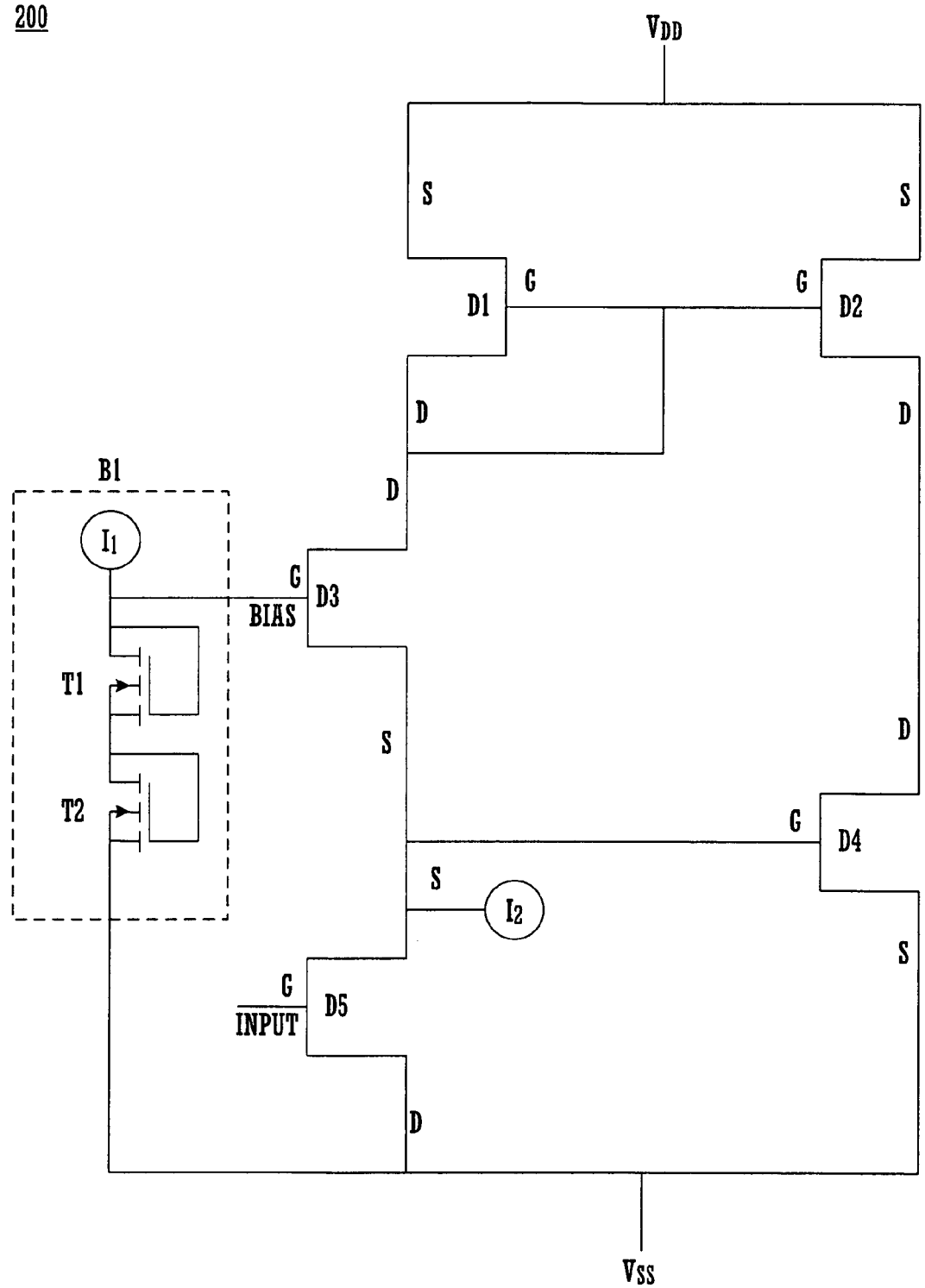
FIG. 2A shows a general schematic diagram for a class AB analog inverter in accordance with an embodiment of the present claimed invention.

FIG. 2A shows a general schematic diagram for a class AB analog inverter 200 in accordance with an embodiment of the present invention. The general circuit comprises five CMOS devices. Each of the five CMOS devices may be a single MOSFET, a composite threshold cascode device such as that shown in FIG. 1A or FIG. 1B, or two transistors with a similar $V_T$ in cascode.

Figure 3A:
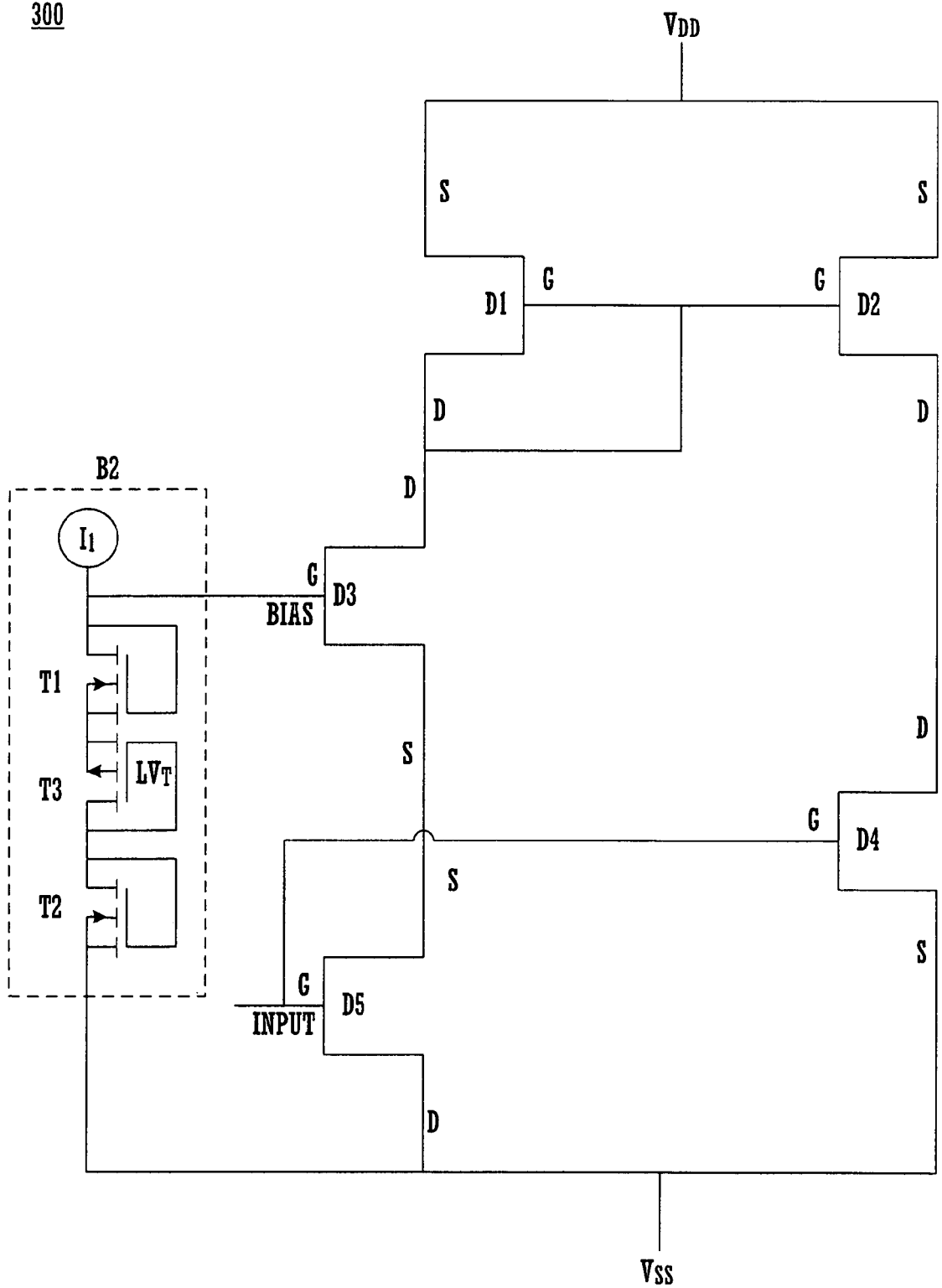
FIG. 3A shows a general schematic diagram for a class AB analog inverter in accordance with an embodiment of the present claimed invention.

The five CMOS devices shown in FIG. 3A include both p-channel (PMOS) and n-channel (NMOS) CMOS devices. For example, devices D1, D2, and D5 may be p-channel devices, with devices D3 and D4 being n-channel devices. The devices may include low $V_T$ transistors that may be individual transistors, or may be part of a composite threshold cascode device.

Each of the five CMOS devices D1–D5 shown in FIG. 2A has a gate (G), source (S), and drain (D). Device D1 and device D2 have a common gate and a common source. Device D3 has a drain coupled to the drain and gate of device D1, and a source coupled to the source of device D5. Device D4 has the drain coupled to the drain of device D2, and the gate coupled to the source of device D3. Device D5 has the drain coupled to the source of device D4. For the inverter 200, the bias is applied at the gate of device D3, and is equal to the sum of the $V_{GS}$ of D3 and the $V_{GS}$ of D4. The input is applied at the gate of device D5. The power supply connections $V_{DD}$ for high side, and $V_{SS}$ (e.g. ground) are also shown.

An example of an optional bias circuit B1 is shown connected to the gate of device D3. The bias circuit B1 comprises a programmable current source I1 coupled to two series diode connected transistors T1 and T2. The voltage drop across transistors T1 and T2 provide the bias voltage to the gate of device D3.

N-channel transistors can be cascoded with NMOS devices of similar $V_T$ with their gates biased at a higher voltage than that of the input to the inverter. Similarly, p-channel transistors can be cascoded with PMOS devices of similar $V_T$ with their gates biased at a lower voltage than that of the input to the inverter.

A second optional programmable current source 12 is shown connected to the source of device D5. When D5 is a low $V_T$ transistor, the current source 12 may be used to enhance the drive on device d4. If device D5 is a p-channel device, I2 is a current source, and if I2 is an n-channel device, I2 is a current sink.

In general, it is desirable that the bias applied to the gate of device D3 be sufficient to provide a small quiescent current to provide class AB operation. Although the circuit is designed for class AB operation, small quiescent currents may be used, thus approaching class B operation.

Figure 2B:
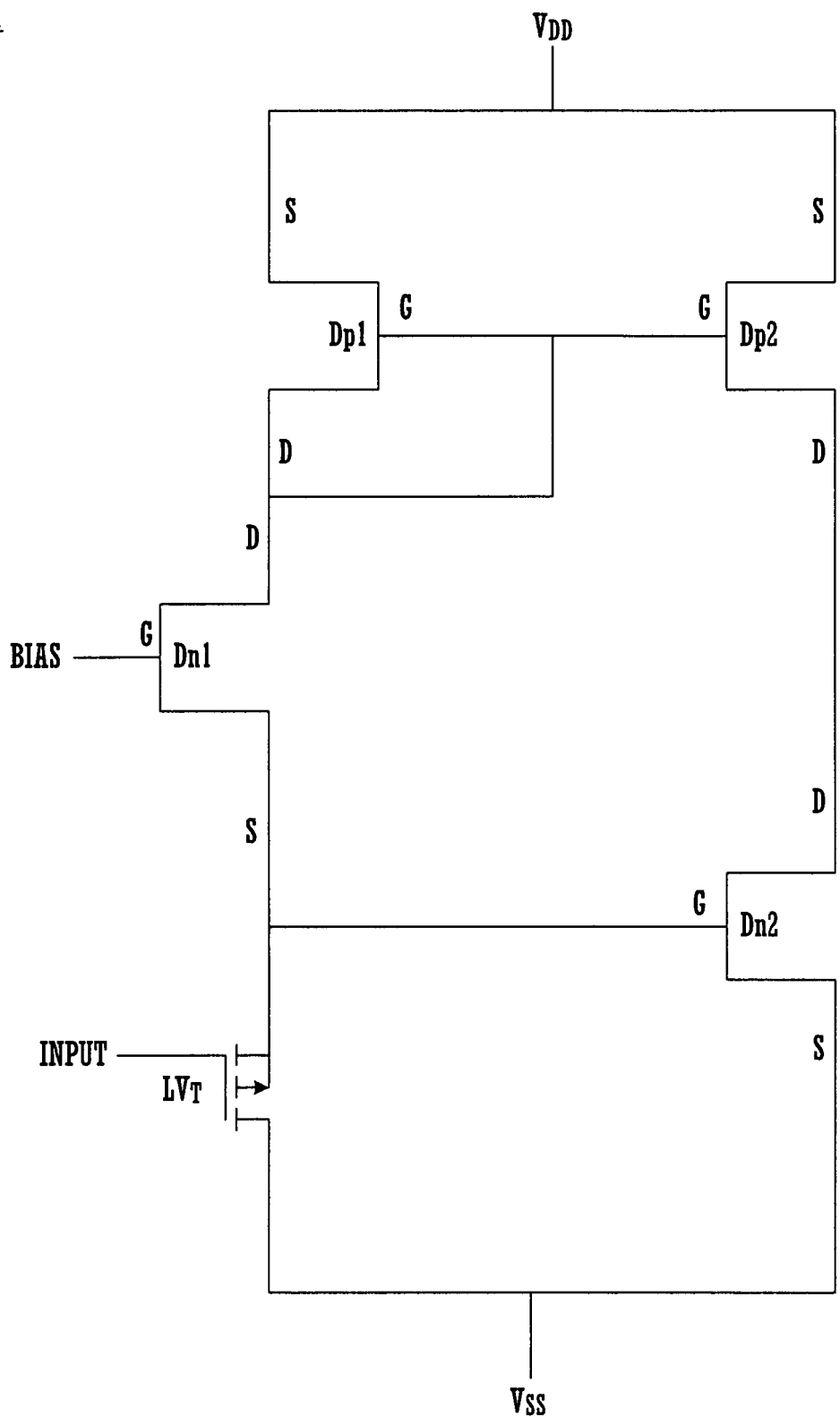
FIG. 2B shows a schematic diagram for a class AB analog inverter in accordance with a preferred embodiment of the present claimed invention.

FIG. 2B shows a schematic diagram for a class AB analog inverter 201 in accordance with a preferred embodiment of the present invention. The circuit 201 of FIG. 2B is a special case of the inverter shown in FIG. 2A. Devices D1, D2, D3, and D4 are specified as Dp1, Dp2, Dn1 and Dn2, respectively. Dp1 and Dp2 are PMOS Devices, and Dn1 and Dn2 are NMOS devices. Device D5 has been specified as a low $V_T$ p-channel MOSFET (LV$_T$). Each of Dp1, Dp2, Dn1, and Dn2 may be a single transistor or a composite threshold cascode device as shown in FIGS. 1A and 1B.

Figure 3B:
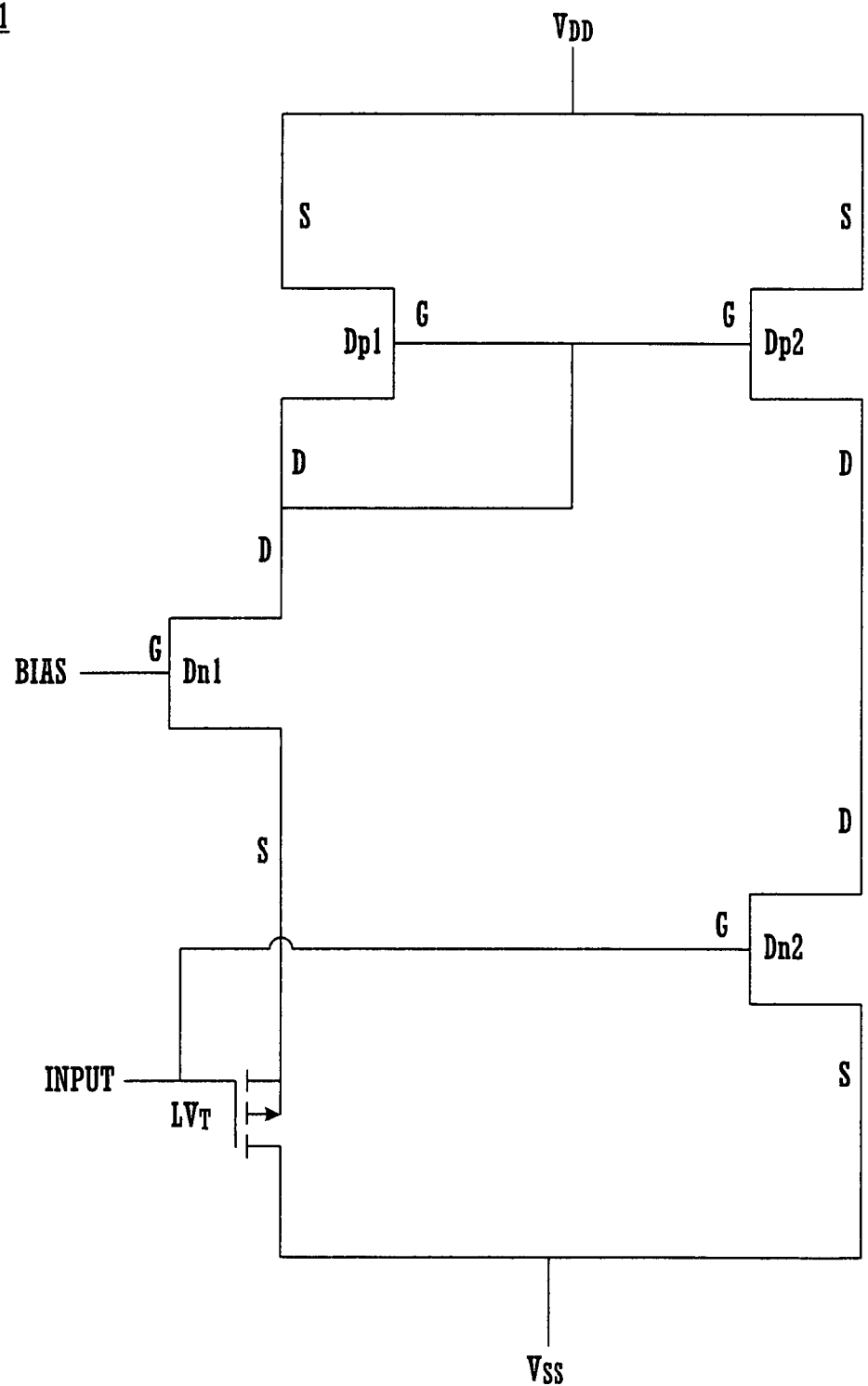
FIG. 3B shows a schematic diagram for a class AB analog inverter in accordance with a preferred embodiment of the present claimed invention.

In a particularly preferred embodiment, Dp1, Dp2, Dn1, and Dn2 are all composite threshold cascode devices. The configuration of FIG. 3B is preferred to its complement (NMOS and PMOS devices reversed) since the input is taken with respect to $V_{SS}$ (ground) instead of $V_{DD}$. The positive supply rail is typically noisier than ground.

FIG. 3A shows a general schematic diagram for another class AB analog inverter 300 in accordance with an embodiment of the present invention. The general circuit comprises five CMOS devices. Each of the five CMOS devices may be a single MOSFET, a composite threshold cascode device such as that shown in FIG. 1A or FIG. 1B, or, or two transistors with the same $V_T$ in cascode.

The five CMOS devices shown in FIG. 3A include both p-channel (PMOS) and n-channel (NMOS) CMOS devices. For example, devices D1, D2, and D5 may be p-channel devices, with devices D3 and D4 being n-channel devices. The inverter 300 will typically comprise at least one p-channel low $V_T$ transistor and one n-channel low $V_T$ transistor. The devices may include low $V_T$ transistors that may be individual transistors, or may be part of a composite threshold cascode device.

Each of the five CMOS devices D1–D5 shown in FIG. 3A has a gate (G), source (S), and drain (D). Device D1 and device D2 have a common gate and a common source. Device D3 has a drain coupled to the drain and gate of device D1, and a source coupled to the source of device D5. Device D4 has the drain coupled to the drain of device D2, and the gate coupled to the gate of device D5. Device D5 has the drain coupled to the source of device D4.

For the inverter 300, the bias is applied at the gate of device D3 and the input is applied at the gate of device D5. The bias in this case is equal to the sum of $V_{GS}$ of D4, $V_{GS}$ of D5, and $V_{GS}$ of D3. Bias may be provided by a bias circuit B2 similar to the bias circuit B1 of FIG. 3A, but with an additional transistor T3 connected in series (e.g. a low $V_T$ p-channel transistor). Power supply connections $V_{DD}$ for high side, and $V_{SS}$ (e.g. ground) are also shown.

FIG. 3B shows a schematic diagram for class AB analog inverter 301 in accordance with a preferred embodiment of the present invention. The circuit 301 of FIG. 3B is a special case of the inverter shown in FIG. 3A. devices D1, D2, D3, and D4 are specified as Dp1, Dp2, Dn1 and Dn2, respectively. Dp1 and Dp2 are PMOS Devices, and Dn1 and Dn2 are NMOS devices. Device D5 has been specified as a low $V_T$ p-channel MOSFET (LV$_T$). Each of Dp1, Dp2, Dn1, and Dn2 may be a single transistor or a composite threshold cascode device as shown in FIGS. 1A and 1B. In a particularly preferred embodiment, Dp1, Dp2, Dn1, and Dn2 are all composite threshold cascode devices, providing a "cascoded inverter" that increases gain and improves power supply rejection.

The cascoded inverters described above may be used in switched capacitor circuits which typically use some form of auto-zeroing to eliminate, or reduce, the effects of transistor offset and drift. For the above described inverters, an "analog ground" or other reference signal is typically unavailable to set a "virtual ground" for the input node (gate of D5). When using the present inverters in switched capacitor circuits, it is desirable for the auto-zeroing to be relatively insensitive to parasitic capacitances, or charge injection dependent upon the difference between the input (gate of D5) and any reference.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the claims appended hereto and their equivalents.

What is claimed is:

1. A complementary metal-oxide semiconductor (CMOS) class AB analog inverter circuit comprising:
   a first CMOS device;
   a second CMOS device comprising a source coupled to a source of said first CMOS device, and a gate coupled to a gate of said first CMOS device;
   a third CMOS device comprising a drain coupled to a drain and a gate of said first CMOS device;
   a fourth CMOS device comprising a drain coupled to a drain of said second CMOS device, a gate coupled to a source of said third CMOS device; and
   a fifth CMOS device comprising a source coupled to a source of said third CMOS device and a drain coupled to a source of said fourth CMOS device.

2. The inverter circuit of claim 1, wherein the first, second, and fifth CMOS devices are p-channel metal-oxide semiconductor (PMOS) devices, and the third and fourth CMOS devices are n-channel metal-oxide semiconductor (NMOS) devices.

3. The inverter circuit of claim 1, wherein the first, second, and fifth CMOS devices are NMOS devices, and the third and fourth CMOS devices are PMOS devices.

4. The inverter circuit of claim 1, wherein at least one of the CMOS devices is a composite threshold voltage ($V_T$) cascode circuit.

5. The inverter circuit of claim 1, wherein at least two of the CMOS devices are composite $V_T$ cascode circuits.

6. The inverter circuit of claim 1, wherein at least three of the CMOS devices are composite $V_T$ cascode circuits.

7. The inverter circuit of claim 1, wherein at least four of the CMOS devices are composite $V_T$ cascode circuits.

8. The inverter circuit of claim 7, wherein said fifth CMOS device is a low $V_T$ transistor.

9. A complementary metal-oxide semiconductor (CMOS) comprising:
   a class AB analog inverter circuit comprising:
   a first CMOS device;
   a second CMOS device comprising a source coupled to a source of said first CMOS device and a gate coupled to a gate of said first CMOS device;
   a third CMOS device comprising a drain coupled to a drain and a gate of said first CMOS device;
   a fourth CMOS device comprising a drain coupled to a drain of said second CMOS device; and
   a fifth CMOS device comprising a source coupled to a source of said third CMOS device, a drain coupled to a source of said fourth CMOS device, and a gate coupled to a gate of said fourth CMOS device, wherein at least one of the CMOS devices is a composite $V_T$ cascode circuit.

10. The inverter circuit of claim 9, wherein at least two of the CMOS devices are composite $V_T$ cascode circuits.

11. The inverter circuit of claim 9, wherein at least three of the CMOS devices are composite $V_T$ cascode circuits.

12. The inverter circuit of claim 9, wherein at least four of the CMOS devices are composite $V_T$ cascode circuits.

13. The inverter circuit of claim 12, wherein said fifth CMOS device is a low $V_T$ transistor.

14. A mixed-signal integrated circuit comprising:
   a class AB analog inverter, wherein said class AB analog inverter comprises:
   a normal $V_T$ p-channel transistor in cascode with a low $V_T$ p-channel transistor; and
   a normal $V_T$ n-channel transistor in cascode with a low $V_T$ n-channel transistor.

15. The integrated circuit of claim 14, wherein said mixed-signal integrated circuit is an analog-to-digital converter (ADC).

16. The integrated circuit of claim 14, wherein said mixed-signal integrated circuit is a digital-to-analog converter (DAC).

17. The integrated circuit of claim 14, wherein said mixed-signal integrated circuit is an active filter.

* * * * *